(12) United States Patent
Alameh et al.

(10) Patent No.: US 8,030,914 B2
(45) Date of Patent: Oct. 4, 2011

(54) PORTABLE ELECTRONIC DEVICE HAVING SELF-CALIBRATING PROXIMITY SENSORS

(75) Inventors: Rachid M. Alameh, Crystal Lake, IL (US); Aaron L. Dietrich, Caledonia, IL (US); Kenneth Allen Paitl, West Dundee, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 164 days.

(21) Appl. No.: 12/344,760

(22) Filed: Dec. 29, 2008

(65) Prior Publication Data

US 2010/0164479 A1 Jul. 1, 2010

(51) Int. Cl.
*G01R 1/38* (2006.01)

(52) U.S. Cl. ....................................... 324/115

(58) Field of Classification Search ............... 324/765, 324/763, 115, 158.1, 750.2, 750.3; 455/550, 455/475.1, 556.1, 90, 95, 414, 425; 702/24, 702/74; 340/980
See application file for complete search history.

(56) References Cited

U.S. PATENT DOCUMENTS

| | | | |
|---|---|---|---|
| 5,179,369 A | 1/1993 | Person et al. | |
| 5,684,294 A | 11/1997 | Kouhi | |
| 5,781,662 A | 7/1998 | Mori et al. | |
| 5,821,521 A | 10/1998 | Bridgelall et al. | |
| 6,002,427 A | 12/1999 | Kipust | |
| 6,107,994 A | 8/2000 | Harada et al. | |
| 6,184,538 B1 | 2/2001 | Bandara et al. | |
| 6,246,862 B1 | 6/2001 | Grivas et al. | |
| 6,292,674 B1 * | 9/2001 | Davis ..................... | 455/550.1 |
| 6,330,457 B1 | 12/2001 | Yoon | |
| 6,525,854 B1 | 2/2003 | Takahashi et al. | |
| 6,804,012 B2 | 10/2004 | Gombert | |
| 6,816,154 B2 | 11/2004 | Wong et al. | |
| 6,933,922 B2 | 8/2005 | Casebolt et al. | |
| 6,941,161 B1 | 9/2005 | Bobisuthi et al. | |
| 7,134,092 B2 | 11/2006 | Fung et al. | |
| 7,212,835 B2 | 5/2007 | Mantyjarvi et al. | |
| 7,340,077 B2 | 3/2008 | Gokturk et al. | |

(Continued)

FOREIGN PATENT DOCUMENTS

EP 1445922 A1 8/2004

(Continued)

OTHER PUBLICATIONS

"Microsoft's SideSight: Something Apple Should Watch", www.gearlog.com (Oct. 20, 2008).

(Continued)

*Primary Examiner* — Ha Tran T Nguyen
*Assistant Examiner* — Tung X Nguyen
(74) *Attorney, Agent, or Firm* — Hisashi D. Watanabe

(57) ABSTRACT

A method of a portable electronic device for self-calibration of a proximity sensor. A background measurement is obtained by the proximity sensor and a detection threshold of the proximity sensor is adjusted based on the background measurement. The background measurement is a measure of a received signal when no signal is transmitted by the proximity sensor, and the detection threshold is associated with a sensitivity of the proximity sensor to environmental conditions. A source signal is emitted by the proximity sensor based on the adjusted detection threshold of the proximity sensor, and a return signal is received by the proximity sensor corresponding to the source signal. A function of the portable electronic device may be performed base don the received return signal.

14 Claims, 6 Drawing Sheets

U.S. PATENT DOCUMENTS

| | | | |
|---|---|---|---|
| 7,368,703 B2 | 5/2008 | De Samber et al. | |
| 7,468,689 B2 | 12/2008 | Ma et al. | |
| 7,486,386 B1 | 2/2009 | Holcombe et al. | |
| 7,489,297 B2 | 2/2009 | Hohmann et al. | |
| 7,519,918 B2 | 4/2009 | Trantow | |
| 7,532,196 B2 | 5/2009 | Hinckley | |
| 7,534,988 B2 | 5/2009 | Kong et al. | |
| 7,630,716 B2 * | 12/2009 | Tamura et al. | 455/439 |
| 2001/0019338 A1 | 9/2001 | Roth | |
| 2002/0122072 A1 | 9/2002 | Selker | |
| 2003/0063128 A1 | 4/2003 | Salmimaa et al. | |
| 2003/0222917 A1 | 12/2003 | Trantow | |
| 2005/0104860 A1 | 5/2005 | McCreary et al. | |
| 2005/0150697 A1 | 7/2005 | Altman et al. | |
| 2005/0232447 A1 | 10/2005 | Shinozuka et al. | |
| 2005/0289182 A1 | 12/2005 | Pandian et al. | |
| 2006/0010400 A1 | 1/2006 | Dehlin et al. | |
| 2006/0028453 A1 | 2/2006 | Kawabe | |
| 2006/0031786 A1 | 2/2006 | Hillis et al. | |
| 2006/0125799 A1 | 6/2006 | Hillis et al. | |
| 2006/0132456 A1 | 6/2006 | Anson | |
| 2006/0161870 A1 | 7/2006 | Hotelling et al. | |
| 2006/0161871 A1 | 7/2006 | Hotelling et al. | |
| 2006/0256074 A1 | 11/2006 | Krum et al. | |
| 2007/0137462 A1 | 6/2007 | Barros et al. | |
| 2007/0177803 A1 | 8/2007 | Elias et al. | |
| 2007/0180392 A1 | 8/2007 | Russo | |
| 2007/0220437 A1 | 9/2007 | Boillot | |
| 2007/0247643 A1 | 10/2007 | Nakamura et al. | |
| 2008/0005703 A1 | 1/2008 | Radivojevic et al. | |
| 2008/0006762 A1 | 1/2008 | Fadell et al. | |
| 2008/0024454 A1 | 1/2008 | Everest | |
| 2008/0052643 A1 | 2/2008 | Ike et al. | |
| 2008/0079902 A1 | 4/2008 | Mandelstam-Manor et al. | |
| 2008/0122803 A1 | 5/2008 | Izadi et al. | |
| 2008/0129688 A1 | 6/2008 | Richardson et al. | |
| 2008/0161870 A1 | 7/2008 | Gunderson | |
| 2008/0165140 A1 | 7/2008 | Christie et al. | |
| 2008/0192005 A1 | 8/2008 | Elogoyhen et al. | |
| 2008/0195735 A1 | 8/2008 | Hodges et al. | |
| 2008/0204427 A1 | 8/2008 | Heesemans et al. | |
| 2008/0211771 A1 | 9/2008 | Richardson | |
| 2008/0219672 A1 | 9/2008 | Tam et al. | |
| 2008/0225041 A1 | 9/2008 | El Dokor et al. | |
| 2008/0240568 A1 | 10/2008 | Tonouchi | |
| 2008/0252595 A1 | 10/2008 | Boillot | |
| 2008/0256494 A1 | 10/2008 | Greenfield | |
| 2008/0266083 A1 | 10/2008 | Midholt et al. | |
| 2008/0297487 A1 | 12/2008 | Hotelling et al. | |
| 2008/0303681 A1 | 12/2008 | Herz et al. | |
| 2009/0031258 A1 | 1/2009 | Arrasvuori et al. | |
| 2009/0061823 A1 | 3/2009 | Chu | |
| 2009/0092284 A1 | 4/2009 | Breed et al. | |
| 2009/0158203 A1 | 6/2009 | Kerr et al. | |
| 2009/0299633 A1 | 12/2009 | Hawes et al. | |
| 2010/0167783 A1 | 7/2010 | Alameh et al. | |

FOREIGN PATENT DOCUMENTS

| | | |
|---|---|---|
| EP | 1657819 A2 | 5/2006 |
| EP | 1760573 A2 | 3/2007 |
| EP | 2000896 A2 | 12/2008 |
| EP | 2037349 A2 | 3/2009 |
| JP | 2280427 A | 11/1990 |
| JP | 2005293419 A | 10/2005 |
| JP | 2006010489 A | 1/2006 |
| JP | 2007042020 A | 2/2007 |
| JP | 2009085799 A | 4/2009 |
| KR | 20030044749 A | 6/2003 |
| KR | 1020050100642 A | 10/2005 |
| WO | 9528777 A1 | 10/1995 |
| WO | 0241129 A2 | 5/2002 |
| WO | 03023701 A2 | 3/2003 |
| WO | 03076870 A1 | 9/2003 |
| WO | 20050076542 A1 | 8/2005 |
| WO | 2005101176 A2 | 10/2005 |
| WO | 2008016394 A2 | 2/2008 |
| WO | 2008073289 A2 | 6/2008 |

OTHER PUBLICATIONS

Metzger, C. et al., "FreeDigiter: A Contact-Free Device for Gesture Control" Eight International Symposium on Wearable Computers, ISWC 2004, Oct. 31-Nov. 3, 2004, 4 pages.

Specification of the Bluetooth System; Master Table of Contents & Compliance Requirements; Covered Core Package V. 3.0+HS; Apr. 21, 2009; 192 pages.

Silicon Laboratories, Inc., Si1120 Evaluation Kit User's Guide; Austin TX, Dec. 2009, 10 pages. www.silabs.com/support/pages/contacttechincalsupport.aspx.

Ward, A. et al., "A New Location Technique for the Active Office" IEEE Personal Communications, vol. 4, Issue 5; Oct. 1997, 11 pages.

Kahn, J.M. et al., "Imaging Diversity Receivers for High-Speed Infrared Wireless Communication", IEEE Communications Magazine, vol. 36, Issue 12, Dec. 1998, pp. 88-94.

Yun, G. and Kavehrad, M., "Spot-Diffusing and Fly-Eye Receivers for Indoor Infrared Wireless Communications" 1992 IEEE International Conference on Selected Topics in Wireless Communications, Jun. 25-26, 1992, pp. 262-265.

Dan Bricklin, "Gestures, the iPhone, and Standards: A Developer's Questions" Internet Discussion @ www.bricklin.com/gestures.htm; Oct. 24, 2007, 10 pages.

"Hadamard Transform" Wikipedia definition; http://en.wikipedia.org/wiki/Hadamard_transform; Downloaded Jan. 12, 2010, 4 pages.

Von Hardenberg, C. and Berard, F., "Bare-Hand Human-Computer Interaction" Proceedings of the ACM Workshop on Perceptive User Interfaces, Orlando, FL, USA, Nov. 15-16, 2001, 8 pages.

"How Trackir Works:" Internet Document @ www.naturalpoint.com/trackir/02-products/product-how-TrackIR-works.html; downloaded Jan. 13, 2010, 2 pages.

U.S. Appl. No. 12/641,830, filed Dec. 18, 2009 "Mobile device with user interaction capability and method of operating same".

U.S. Appl. No. 12/428,187, filed Apr. 22, 2009 "Menu Configuration System and Method for Display on an Electronic Device".

U.S. Appl. No. 12/428,266, filed Apr. 22, 2009 "Touch-Screen and Method for an Electronic Device".

U.S. Appl. No. 12/500,625, filed Jul. 10, 2009 "Devices and Methods for Adjusting Proximity Detectors".

U.S. Appl. No. 12/646,199, filed Dec. 23, 2009 "Method and system for controlling data transmission to or from a mobile device".

U.S. Appl. No. 12/471,062, filed May 22, 2009 "Sensing Assembly for Mobile Device".

U.S. Appl. No. 12/646,601, filed Dec. 23, 2009, "Electronic device with sensing assembly and method for detecting gestures of geometric shapes".

U.S. Appl. No. 12/643,211, filed Dec. 21, 2009 "Electronic device with sensing assembly and method for interpreting consecutive gestures".

U.S. Appl. No. 12/640,867, filed Dec. 17, 2009 "Electronic device with sensing assembly and method for detecting basic gestures".

U.S. Appl. No. 12/645,244, filed Dec. 22, 2009 "Method and system for conducting communication between mobile devices".

U.S. Appl. No. 12/648,503, filed Dec. 29, 2009 "Electronic device with sensing assembly and method for interpreting offset gestures".

PCT Notification of Transmittal of the International Search Report and the Written Opinion of the International Searching Authority, of the Declaration, Jul. 16, 2010, pp. 1-11, PCT/US2009/066555, Korean Intellectual Property Office.

PCT, "Notification of Transmittal of the International Search Report and the Written Opinion of the International Searching Authority, or the Declaration", Sep. 30, 2010, pp. 1-13, PCT/US/2010/039561, European Patent Office.

Patent Cooperation Treaty, "PCT Search Report and Written Opinion of the International Searching Authority" for International Application No. PCT/US2010/030964 Nov. 9, 2010, 24 pages.

Patent Cooperation Treaty, "PCT Search Report and Written Opinion of the International Searching Authority" for International Application No. PCT/US2010/028654 Dec. 1, 2010, 22 pages.

Patent Cooperation Treaty, "PCT Search Report and Written Opinion of the International Searching Authority" for International Application No. PCT/US2010/033472 Dec. 15, 2010, 9 pages.

PCT, "Notification of Transmittal of the International Search Report and Written Opinion of the International Searching Authority, of the Delaration", Mar. 17, 2011, pp. 1-14, PCT/US2010/061251, European Patent Office.

PCT, "Notification of Transmittal of the International Search Report and Written Opinion of the International Searching Authority, of the Delaration", Apr. 7, 2011, pp. 1-16, PCT/US2010/061254, European Patent Office.

United States Patent and Trademark Office "Non-Final Office Action Summary", Apr. 25, 2011, pp. 1-33, U.S. Appl. No. 12/471,062, Alexandria, Virginia, USA.

* cited by examiner

PORTABLE ELECTRONIC DEVICE HAVING SELF-CALIBRATING PROXIMITY SENSORS

FIELD OF THE INVENTION

The present invention relates generally to the field of electronic devices having one or more proximity sensors. More particularly, the present invention relates to a wireless communication device having one or more proximity sensors with self-calibrating capabilities.

BACKGROUND OF THE INVENTION

Proximity sensors are capable of detecting the presence of nearby objects without any physical contact. In particular, a proximity sensor emits an electromagnetic or electrostatic field, and observes changes in the field. In doing so, the proximity sensor detects any position changes of nearby objects based on changes to the electromagnetic or electrostatic field caused by the objects' presence.

Wireless communication devices may utilize proximity sensors to manage the user experience and power consumption of its audio and video output components when adjacent to a user's ear. In particular, these devices may reduce speaker volume when the device's earpiece is positioned near the user's ear to avoid discomfort to the user's eardrums. As another example, the proximity sensor may turn off the device display when the device is positioned near the user's ear to save power. Thus, these types of wireless communication device dynamically adjust the operation of audio and video output components when these components are positioned very close to, i.e., adjacent to, a user's ear.

DETAILED DESCRIPTION OF THE EMBODIMENTS

There is described portable electronic device having one or more sensors with self-calibration capabilities. In particular, each proximity sensor of the device is capable of dynamically deriving a detection threshold as a portion of received background conditions. The sensors of the self-calibrating device dynamically adjust its own power consumption based on the environment conditions surrounding the device, resulting to minimized power consumption. In addition, the sensors of the self-calibrating, low power device are capable of monitoring a broad range of environmental conditions, i.e., far away as well as nearby, surrounding the device due to its ultra-sensitivity, resulting in optimized functionality. The ultra-sensitivity of the sensors is accomplished by detecting near noise level or, more particularly, by setting the detection threshold just above the noise level as a portion of the received signal, allowing for detection of miniscule disturbances.

The proximity sensors of the portable electronic device in accordance with the present invention may operate in multiple, different modes. These modes are context driven and the area of coverage, such as, range, angle, and active sensors, may be adaptively set and adjusted based on input from other sensors of the device. Context information may be used to set the range and/or coverage of each proximity sensor to achieve the desired functionality while keeping power consumption to a minimum. For example, if the portable electronic device is positioned near the user's head, the set range of the proximity sensor may be minimized and applications may be disabled, such as operations of an input component, to conserve power. If the portable communication device is operating in a two-handed user mode, the sensors may detect which hand of the user is supporting the back of the device, estimate the device location relative to the user, disable select sensors, increase the range of select sensors, and the like. If the portable electronic device is placed on a horizontal surface, such as a table, the proximity sensors may be adjusted to operate at maximum range and monitor to detect any disturbances which may indicate user presence. Also, the proximity sensors may be used to determine which side of the device the user is walking near and, in response, deactivate the remaining proximity sensors, i.e, those sensors directed away from the user. If portable electronic device is face down on a horizontal surface, i.e., a user interface is not visible to proximate users, the proximity sensors directed upward relate to the surface may be active and the remaining sensors may be disabled.

Figure 1:
FIG. 1 is a general representation of an example environmental condition where the present invention may be utilized.

Referring to FIG. 1, there is shown a general representation of an example environmental condition where the present invention may be utilized. A portable electronic device 101 in accordance with the present invention may be carried by a user or, as shown in FIG. 1, placed remote from the user. For example, the portable electronic device 101 may be placed on another object, such as a horizontal surface 103. The portable electronic device 101 may use its proximity sensors to detect conditions in an environment 105 when the device is carried by the user or placed remote from the user, the device is particularly useful when it is stationary. Proximity sensors of the portable electronic device 101 are capable of detecting the presence of nearby objects, particularly when the objects change position relative to the device. For example, the proximity sensors are capable of detecting the slightest activity or movement of people 107, 109 locating within the environment 105 in the proximity of the device 101. Some people 107 may be nearby the device 101, whereas others may be distal from the device.

Figure 2:
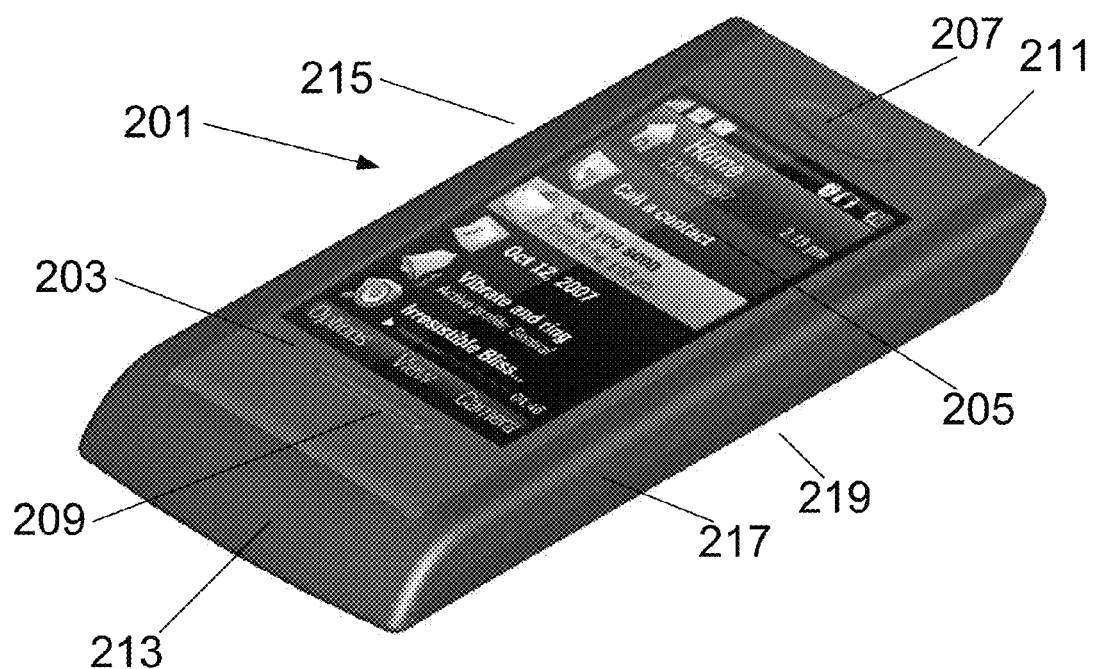
FIG. 2 is a perspective view of an embodiment in accordance with the present invention.

Referring to FIG. 2, there is illustrated a perspective view of an embodiment in accordance with the present invention. The embodiment may be any type of portable electronic device 201 having one or more proximity sensors and capability of performing self-calibration functions of the proximity sensor(s) in accordance with the present invention. Examples of the portable electronic device 201 include, but are not limited to, cellular-based mobile phones, WLAN-based mobile phones, notebook or laptop computing devices, personal digital assistants, personal navigation device, touch screen input device, pen-based input devices, portable video and/or audio players, and the like.

For one embodiment, the portable electronic device 201 has a housing comprising a front surface 203 which includes a visible display 205 which may include touch screen capabilities. For another embodiment, the portable electronic device 201 may include a plurality of input keys in conjunction with the display 205. For yet another embodiment, the portable electronic device 201 may comprise apertures 207, 209 for audio output and input at the front surface 203. It is to be understood that the portable electronic device 201 may include a variety of different combination of displays and interfaces.

In addition to the front surface 203, the housing of the portable electronic device 201 may also include a top surface 211, a bottom surface 213, side surfaces 215, 217, and a back surface 219. The top surface 211, the bottom surface 213, the side surfaces 215, 217 of the housing of the portable electronic device 201 are not required to have any particular shape or configuration relative to the front and back surfaces 203 and 219.

The front surface 203, the top surface 211, the bottom surface 213, the side surfaces 215, 217, and the back surface 219 of the housing may support one or more proximity sensors. Although some proximity sensors may be exposed at a surface of the housing, it is recognized that some types of proximity sensors may function while concealed behind a surface of the housing. If the portable electronic device 201 includes two or more proximity sensors, then proximity sensors may be positioned at opposing surfaces of the housing, so that sensor is directed in a first direction and another sensor is directed in a second direction substantially opposite the first direction, in order to maximize the broadest detection coverage of the conditions about the environment 105.

Figure 3:
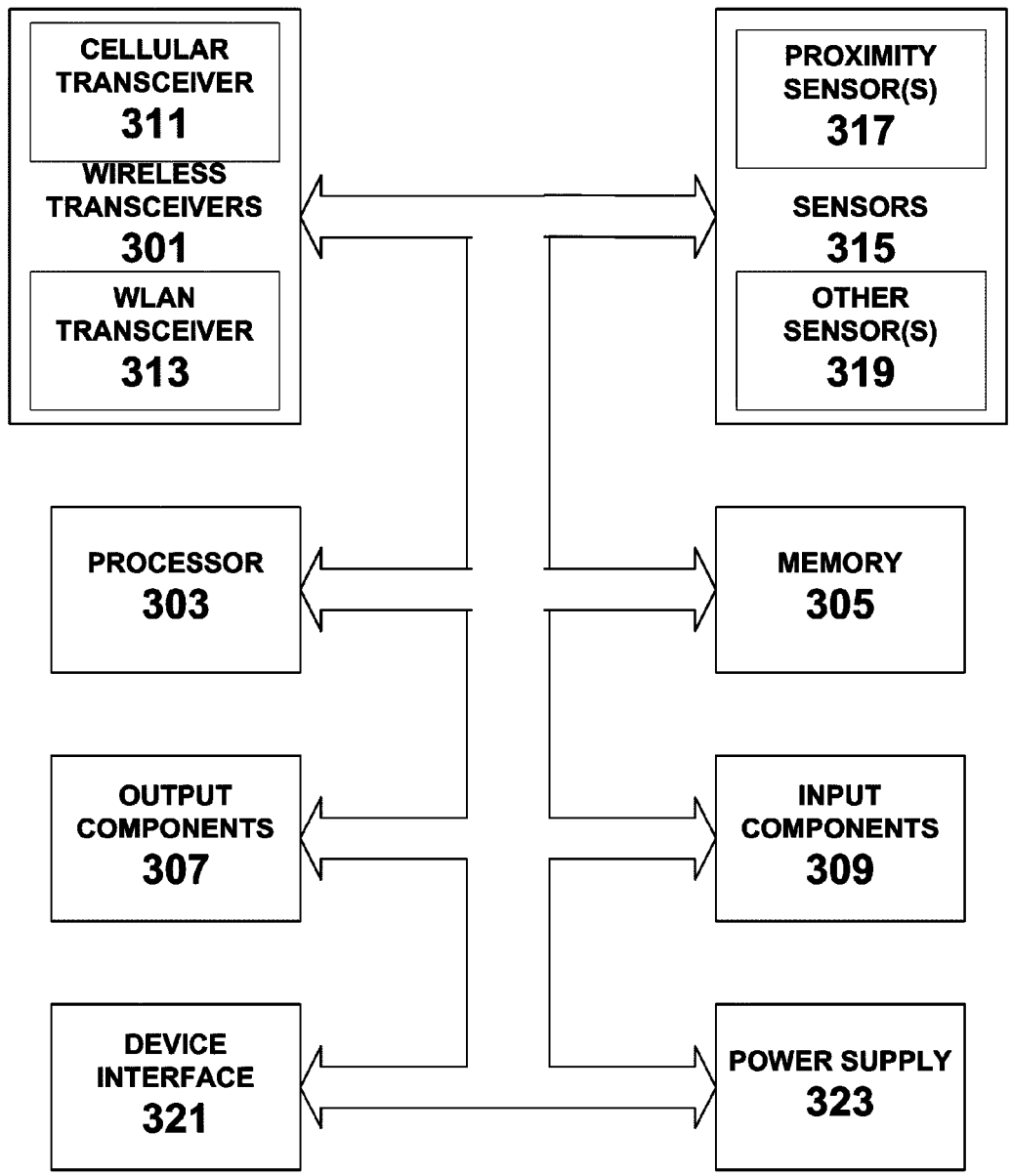
FIG. 3 a block diagram representing example components that may be used for an embodiment in accordance with the present invention.

Referring to FIG. 3, there is shown a block diagram representing example components that may be used for an embodiment in accordance with the present invention. The example embodiment includes one or more wireless transceivers 301, a processor 303, a memory 305, one or more output components 307, and one or more input components 309. Each embodiment may include a user interface that comprises one or more output components 307 and one or more input components 309. Each wireless transceiver 301 may utilize wireless technology for communication, such as, but are not limited to, cellular-based communications such as analog communications (using AMPS), digital communications (using CDMA, TDMA, GSM, iDEN, GPRS, or EDGE), and next generation communications (using UMTS, WCDMA, LTE or IEEE 802.16) and their variants, as represented by cellular transceiver 311. Each wireless transceiver 301 may also utilize wireless technology for communication, such as, but are not limited to, peer-to-peer or ad hoc communications such as HomeRF, Bluetooth and IEEE 802.11 (a, b, g or n); and other forms of wireless communication such as infrared technology, as represented by WLAN transceiver 313. Also, each transceiver 201 may be a receiver, a transmitter or both.

The processor 303 may generate commands based on information received from one or more input components 309 and one or more sensors 315. The processor 303 may process the received information alone or in combination with other data, such as the information stored in the memory 305. Thus, the memory 305 of the internal components 300 may be used by the processor 303 to store and retrieve data. The data that may be stored by the memory 305 include, but is not limited to, operating systems, applications, and data. Each operating system includes executable code that controls basic functions of the portable electronic device, such as interaction among the components of the internal components 300, communication with external devices via each transceiver 301 and/or the device interface (see below), and storage and retrieval of applications and data to and from the memory 305. Each application includes executable code utilizes an operating system to provide more specific functionality for the portable electronic device. Data is non-executable code or information that may be referenced and/or manipulated by an operating system or application for performing functions of the portable electronic device. For example, the processor 303 may retrieve information the memory 305 to calibrate the sensitivity of the sensors 315.

The input components 309 of the internal components 300 may include a video input component such as an optical sensor (for example, a camera), an audio input component such as a microphone, and a mechanical input component such as button or key selection sensors, touch pad sensor, touch screen sensor, capacitive sensor, motion sensor, and switch. Likewise, the output components 307 of the internal components 300 may include a variety of video, audio and/or mechanical outputs. For example, the output components 307 may include a video output component such as a cathode ray tube, liquid crystal display, plasma display, incandescent light, fluorescent light, front or rear projection display, and light emitting diode indicator. Other examples of output components 307 include an audio output component such as a speaker, alarm and/or buzzer, and/or a mechanical output component such as vibrating or motion-based mechanisms.

The sensors 315 are similar to the input components 309, but are particularly identified separately in FIG. 3 due to their importance for the present invention. The portable electronic device 100, in accordance with the present invention, may include at least one proximity sensor 315 to detect the presence of nearby objects. For example, as illustrated by FIG. 2, the sensors 315 may include one or more proximity sensors 317 such as, but not limited to, capacitive, magnetic, inductive, optical/photoelectric, laser, acoustic/sonic, radar-based, Doppler-based, thermal, and radiation-based proximity sensors. For example, the proximity sensor 317 may be an infrared proximity sensor that transmits a beam of infrared (IR) light, and then computes the distance to any nearby objects from characteristics of the returned, reflected signal. The returned signal may be detected using an IR photodiode to detect reflected light emitting diode (LED) light, responding to modulated IR signals, and/or triangulation. The sensors 315 may also include one or more other sensors 319. Examples of these other sensors 319 include, but are not limited to, accelerometers, touch sensors, surface/housing capacitive sensors, and video sensors (such as a camera). For example, an accelerometer may be embedded in the electronic circuitry of the portable electronic device 201 to show vertical orientation, constant tilt and/or whether the device is stationary. Touch sensors may used to indicate whether the device is being touched at the side surfaces 215, 217, thus indicating whether or not certain orientations or activities/movements are intentional by the user.

The internal components 300 may further include a device interface 321 to provide a direct connection to auxiliary components or accessories for additional or enhanced functionality. In addition, the internal components 300 preferably include a power source 323, such as a portable battery, for providing power to the other internal components and allow portability of the portable electronic device 101.

It is to be understood that FIG. 3 is provided for illustrative purposes only and for illustrating components of a portable electronic device in accordance with the present invention, and is not intended to be a complete schematic diagram of the various components required for a portable electronic device. Therefore, a portable electronic device may include various other components not shown in FIG. 3, or may include a combination of two or more components or a division of a particular component into two or more separate components, and still be within the scope of the present invention.

Figure 4A:
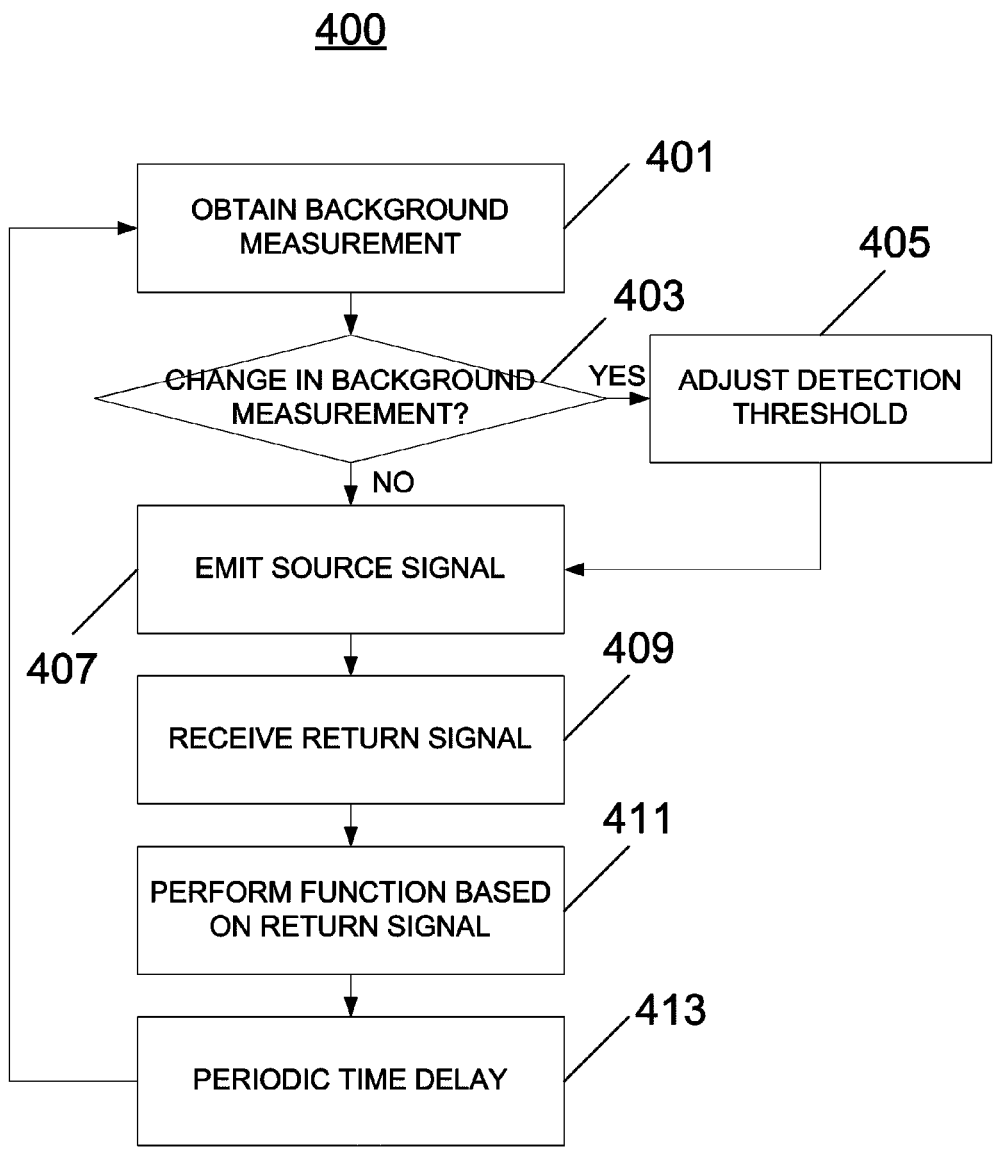
FIGS. 4A, 4B and 4C are flow diagrams representing operations of an embodiment in accordance with the present invention.

Referring to FIG. 4A, there is shown a flow diagram representing a first operation 400 of an embodiment in accordance with the present invention. For this first operation 400, the portable electronic device 101 obtains a background measurement each time before one or more proximity sensors are activated. At step 401, one or more proximity sensors 317 of the portable electronic device 101 obtain a background measurement. As shown in FIG. 4A, a background measurement may be taken before each magnitude measurement for the detection threshold. A background measurement is a measurement of the received signal when no signal is being transmitted by the proximity sensor(s) 317. For another embodiment, statistics of the background may be accumulated and used to determine an appropriate threshold for the magnitude measurement. The accumulated statistic includes at least one of mean, standard deviation, maximum signal level, or minimum signal level. The threshold can then adaptively change as the environment changes and, thus, is reflected in the background measurements. If a random noise spike does occur during a magnitude measurement that exceeds the threshold, the processor 303 or proximity sensor 317 may obtain additional information from other sensor 319 to determine if the magnitude measurement was corrupted.

After obtaining the background measurement at step 401, the portable electronic device 101 may determine whether the background measurements warrant an adjustment to the detection threshold of one or more proximity sensor 317 at step 403. The portable electronic device 101 may update the detection threshold every time a background measurement is obtained, but adjustment of the detection threshold may only be necessary when the background measurement indicates a change. The portable electronic device 101 may also decide to adjust the detection threshold by identifying the background measurement as exceeding a predetermined noise threshold. Further, as stated above, the portable electronic device 101 may distinguish activity or movement from nearby objects from random noise spikes or corrupt measurements to avoid adjusting the detection threshold unnecessarily or inappropriately.

If the adjustment is warranted, then the portable electronic device 101 may adjust the detection threshold of one or more proximity sensors 317 based on the background measurement at step 405. The detection threshold is associated with a sensitivity of the proximity sensor 317 to environmental conditions, which may be detected by sensors 319 other than the proximity sensor(s) 317. Also, the same detection threshold may be used for multiple proximity sensors 317, or separate detections thresholds for different proximity sensors. The portable electronic device 101 may determine an appropriate detection threshold based on information from a sensor 319 other than the proximity sensor in conjunction with the background measurement by the proximity sensor(s) 317. Examples of sensors 319 other than the proximity sensor(s) 317 includes, but at not limited to, a touch sensor, a light sensor or an accelerometer. The portable electronic device 101 may also determine an appropriate detection threshold based on date information, time information, or both, in conjunction with the background measurement by the proximity sensor(s) 317.

The portable electronic device 101 may adjust the detection threshold based on a predetermined fraction, percentage, ratio or other calculation based on the background measurement. The portable electronic device 101 may also dynamically adjust the detection threshold lower for even better detection results based on information received from other sensors 319, such as, but not limited to, time of day, use habits, environment, in use status showing receiver output was unchanged for a long time, time of day prediction if a user is expected to be asleep, etc.

Regardless of whether or not the detection threshold of the proximity sensor(s) 317 is adjusted, the first operation 400 continues by emitting a source signal by the proximity sensor based on the adjusted detection threshold of the proximity sensor at step 407, and receiving a return signal by the proximity sensor corresponding to the source signal at step 409. The portable electronic device 101 may perform one or more functions based on the return signal at step 411. For example, the device 101 may activate an output component 307, such as an audio, visual and/or mechanical indicator, in order to attract the attention of a nearby person. As another example, the device 101 activate or keep active one or more functions if activity or movement of a nearby object is detected, or otherwise deactivate functions to conserve energy if no activity or movement is detected. Thereafter, the portable electronic device 101 may obtain another background measurement at step 401 or wait a predetermined time period at step 413 before obtaining another background measurement.

Figure 4B:
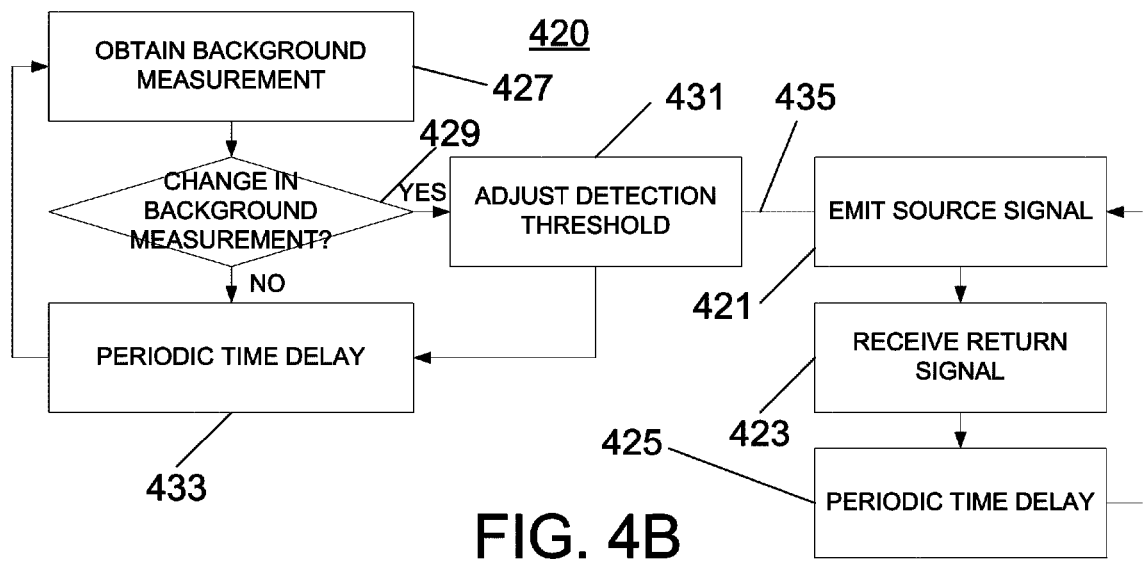

Referring to FIG. 4B, there is shown another flow diagram representing a second operation 420 of an embodiment in accordance with the present invention. For this second operation 420, the portable electronic device 101 obtains a background measurement independent of when one or more proximity sensors are activated. Each proximity sensor 317 may emit a source signal at step 421, and receive a return signal corresponding to the source signal at step 423. After a predetermined time period at step 425, the device 101 may continue to emit the source signal and receive the return signal repeatedly. Similar to the first operation 400 above, the portable electronic device 101 may perform one or more functions based on the return signal after step 423.

Separately, the portable electronic device 101 may obtain a background measurement by the proximity sensor on a periodic basis. After obtaining the background measurement at step 427, the portable electronic device 101 may determine whether the background measurements warrant an adjustment to the detection threshold of one or more proximity sensor 317 at step 429. If the adjustment is warranted at step 429, then the portable electronic device 101 may adjust the detection threshold of one or more proximity sensors 317 based on the background measurement at step 431. For this second operation 420, the emission/receiving process would have a link 435 to the detection threshold adjustment process, so that the adjusted detection threshold may be utilized the next time the source signal is emitted at step 421. Finally, the detection threshold adjustment process may include a delay of time at step 422 before obtaining the next background measurement at step 427.

Figure 4C:
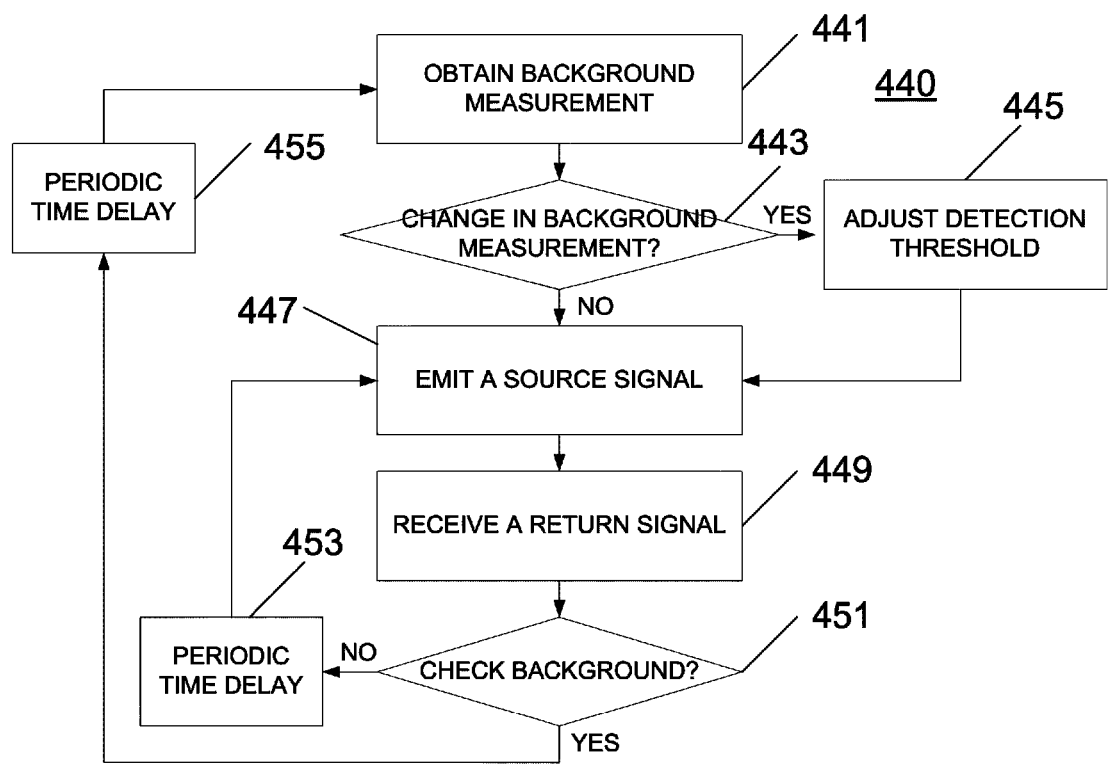

Referring to FIG. 4C, there is shown yet another flow diagram representing a third operation 440 of an embodiment in accordance with the present invention. For this third operation 440, the portable electronic device 101 obtains a background measurement after a predetermined number of times when one or more proximity sensors are activated, or in response to detecting a change in the environmental conditions.

After obtaining the background measurement at step 441, the portable electronic device 101 may determine whether the background measurements warrant an adjustment to the detection threshold of one or more proximity sensor 317 at step 443. If the adjustment is warranted, then the portable electronic device 101 may adjust the detection threshold of one or more proximity sensors 317 based on the background measurement at step 445. Regardless of whether or not the detection threshold of the proximity sensor(s) 317 is adjusted, the third operation 440 continues by emitting a source signal by the proximity sensor based on the adjusted detection threshold of the proximity sensor at step 447, and receiving a return signal by the proximity sensor corresponding to the source signal at step 449. Similar to the first and second operations 400, 420 above, the portable electronic device 101 may perform one or more functions based on the return signal after step 449.

Thereafter, the portable electronic device 101 may determine whether another background measurement should be obtained at step 451. For example, the device 101 may include a counter, so that the device may obtain a background measurement after a certain number of source signals have been emitted and a certain number of return signals have been received. For another example, the device 101 initiate a background measure only if a sensor 319 other than the proximity sensor(s) 317 provide information indicating a change in the environmental conditions about the device. The third operation 440 continues at step 441 if a background check is desired, and the third operation continues at step 447 if a background check is not needed. Also, the portable electronic device 101 may wait a predetermined time period at step 453 or step 455 before obtaining another background measurement or emitting another source signal.

The example operation may be represented by the following possible scenario. A user may place the portable electronic device 101 on a table, and leave it there as she or he moves away from it. When the user 107 approaches the device 101, the device detects, at a lower power mode, user presence and which side user is approaching. The portable electronic device 101 detects being stationary on a horizontal surface 103 and detect its orientation. Regarding the orientation, an accelerometer for example may not detect change and may indicate whether the device is upside down or right side up, and touch sensors may detect contact or lack thereof. The device 101 then initiates bursts at the proximity sensors at maximum power or a predetermined high-power level. If the device 101 includes more that two proximity sensors, then the proximity sensors to activate or keep active are selected based on the orientation of the device. The maximum or high-level power bursts may be enabled, since the device 101 is expected to be far from the user for this scenario. The bursting may be initiated right away, i.e., as soon as device 101 is placed down or after certain time delay to increase the chance that the receivers of the proximity sensors start to measure quiescent/background returns.

Figure 5:
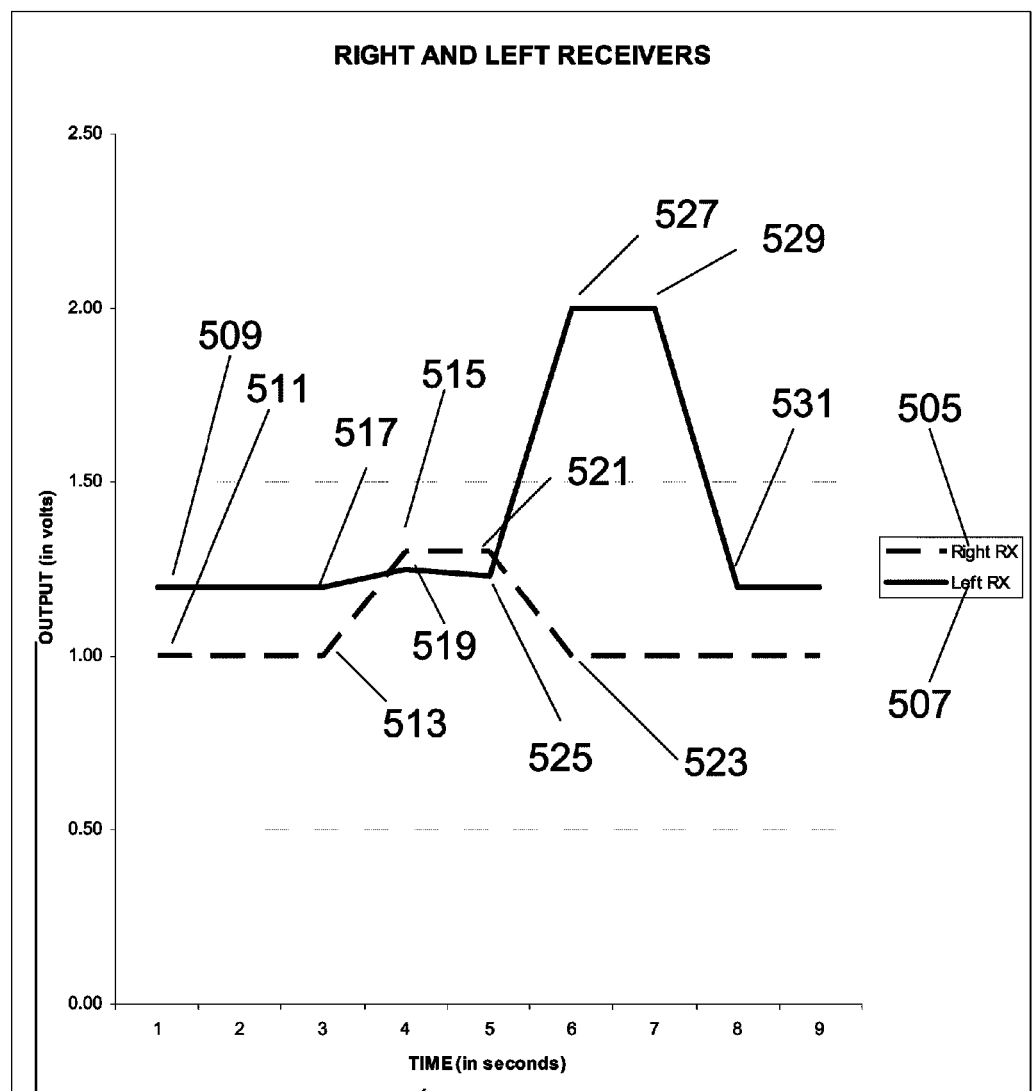
FIG. 5 is a graphical representation illustrating the results of an example operation of an embodiment in accordance with the present invention.

Referring to FIG. 5, there is shown a graphical representation illustrating the results of an example operation 500 of an embodiment in accordance with the present invention. The horizontal axis 501 of this graphical representation represents time, in seconds, and the vertical axis 503 of this graphical representation represents output, in volts. For this operation 500, the operation of the portable electronic device 101 is context driven, where the device is positioned on a horizontal surface 103. Also, for this operation 500, the portable electronic device 101 includes a proximity sensor 317 at opposing sides, such as a first proximity sensor 505 at the first side 215 and a second proximity sensor 507 at the second side 217 opposite the first side. In FIG. 5, the first proximity sensor 505 and the first side 215 is identified as "Left RX", and the second proximity sensor 507 at the second side 217 is identified as "Right RX".

The processor 303 read the receiver outputs of both proximity sensors 505, 507, and continues to take readings periodically. The processor 303 then observes the values that are similar for each of the outputs. These readings correspond to circuit bias, background interference/lighting, and/or user presence. A reading of "1" is mostly constant in this operation 500 and should represent the situation where the user (or anyone else) is away from the portable electronic device 101. The processor 303 then sets a user detection threshold as a percentage of "1", i.e., self-calibrates itself. The processor 303 also detects which side the user is detected by the device 101. For example, the determination of the side of detection may be used to direct audio or rotate an image toward the user when she or he comes near. This is down by looking at receiver outputs of both proximity sensors 505, 507.

The processor 303 may use the same detection threshold for multiple proximity sensors, or separate detections thresholds for different proximity sensors. For example, the right side detection threshold for the first proximity sensor 505 may be 1.00 volts+delta. Thus, if the delta, by way of example, is predetermined at $\frac{1}{10}$ or 10%, then the right side detection threshold may be set at 1.1 volts of output. For another example, the left side detection threshold for the second proximity sensor 507 may be 1.20 volts+delta. Thus, if the delta is, again, predetermined at $\frac{1}{10}$ or 10%, then the left side detection threshold may be set at 1.32 volts of output.

For the embodiment represented by FIG. 5, the processor 303 measures, for the first three seconds of operation, a voltage reading 509 of 1.00 volt at the first proximity sensor 505 and a voltage reading 511 of 1.20 volts at the second proximity sensor 507. The non-varying characteristic of these first and second voltage readings 509, 511 indicate that activity or movement by objects in the environment 105 surrounding the device 101 is not detected by the proximity sensors 505, 507. For example, the user 107 may have been away from portable electronic device 101 for first three seconds.

For the next two seconds of operation, i.e., the 4th and 5th seconds, the voltage readings 513, 515 at the first proximity sensor 505 increases to, and levels-off at, 1.30 volts, thus indicating that the first proximity sensor detects significant activity or movement for that two second period of time. During that same time period, the voltage reading 517 at the second proximity sensor 507 increases slightly to 1.22 volts and then another voltage reading 519 at the second proximity sensor decreases even more slightly to 1.21 volts. The slight detection at the second proximity sensor 507, when considered by itself, would not necessarily indicate any type of detection of an object, i.e., user, in proximity of the sensor. However, when this slight detection of the second proximity sensor 507 is considered in conjunction with the detection at the first proximity sensor 505, these two readings indicate that activity or movement is detected by both proximity sensors, in which the location of the detected object relative to the device 101 may be determined based on the sensor detecting the greater percentage change. For example, the user 107 may walk by the right side 217 of the portable electronic device 101 for two seconds, which may have been detected by the proximity sensor at the right side 217. The activity or movement by the right side 217 of the user 107 may have also caused a minor disturbance, which may have been detected by the proximity sensor at the left side 215.

For the following two seconds of operation, i.e., the 6th and 7th seconds, the voltage readings 521, 523 at the first proximity sensor 505 decreases back down to, and levels-off at, the previous voltage level, i.e., to 1.00 volts, thus indicating that the first proximity sensor no longer detects activity or movement for that two second period of time. During that same time period, the voltage readings 525, 527 at the second proximity sensor 507 increases substantially to, and levels-off at, 2.00 volts. The substantial increase in signal detection by the second proximity sensor 507 indicates higher energy motion or motion by multiple objects at the second side 217 of the portable electronic device 101. Also, in contrast to the previous time period where changes were detected by both proximity sensors 505, 507, the detection by the second proximity sensor and the lack of detection by the first proximity sensor indicates that all detection motion is at the second side 217 of the device 101. For example, the user 107 may further walk by the left side 215 of the portable electronic device 101 for two seconds.

For the last two seconds of operation, i.e., the 8th and 9th seconds, the voltage readings of the first proximity sensor 505 remain unchanged and the voltage readings 529 and 531 of the second proximity sensor 507 decreases back down to, and level-off at, the previous, initial voltage level, i.e., to 1.2 volts. Accordingly, the receiver outputs of both proximity sensors 505, 507 indicate that the proximity sensors no longer detect activity or movement for that two second period of time. For example, the user 107 may have further moved away from the portable electronic device 101.

A background measurement may be taken before each magnitude measurement for the detection threshold. A background measurement is a measurement of the received signal when no signal is being transmitted. The background measurement provides a measure of the noise. Statistics of the background are accumulated (e.g. average, standard deviation, max, min, etc.) and used to determine an appropriate threshold for the magnitude measurement. The threshold can then adaptively change as the environment changes and is reflected in the background measurements. If a random noise spike does occur during a magnitude measurement that exceeds the threshold, coding will provide additional information to know if the magnitude measurement was corrupted.

Figure 6:
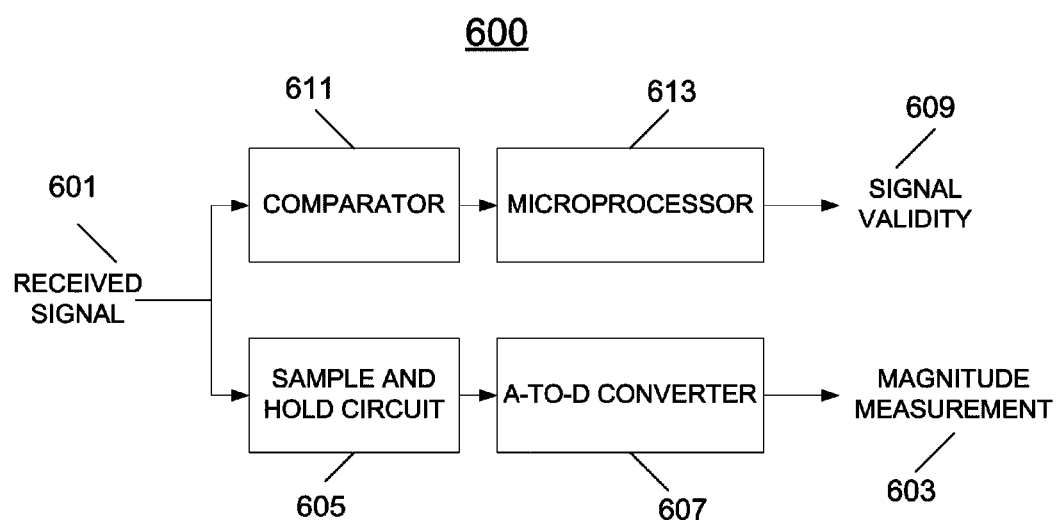
FIG. 6 is a block diagram representing an example circuit for minimizing the impact of background noise in accordance with the present invention.

Referring to FIG. 6, a coding circuit 600 may be implemented to minimize the impact of background noise. Coding by the circuit 600 is performed by transmitting multiple coding pulses, in which the receiver knows the timing of the coding pulses, and checking for whether a particular signal is present or not present in the returning or received signal 601 at the appropriate time. For example, a proximity sensor may send four coding pulses, and the coding circuit may determining the validity of the returning signal 601 corresponding to these four coding pulses based on the timing of the coding pulses of the returning signal. If the pulses of the received signal 601 are received properly, the magnitude measurement 603 is considered to be valid; otherwise, the magnitude measurement may be corrupt. For example, an optical proximity sensor may be corrupted by extraneous light sources in the environment, such as light flashes from another device. If the magnitude measurement 603 is valid, then it may be used to determine the detection threshold as described above. The detection threshold of the proximity sensor may be adjusted based on the magnitude measurement in response to determining that the return signal meets or exceeds a predetermined criterion, as described below.

The magnitude measurement 603 is taken soon after the coding pulses are transmitted. A sample and hold circuit 605 is used to sample the magnitude of the received signal when one of the pulses is transmitted. For example, a peak detector may be used as a sample and hold circuit. The output of the sample and hold circuit 605 may be input to an analog-to-digital ("A-to-D") converter 607. It should be noted that the sample and hold circuit 605 may be separate from the A-to-D converter 607 as shown in FIG. 6, or the circuit may integrated in the A-to-D converter. The sample and hold circuit 605 may be used to reduce the timing requirements of the A-to-D converter 607. The width of the transmitted coding pulses may be minimized, since the sample and hold circuit 605 is aware of the timing when the pulses are transmitted which, in turn, saves current drain of components that consume a significant amount of current, such as the transmitter.

The coding circuit 600 may also check signal validity 609 as well as the magnitude measurement 603. The coding circuit 600 determines whether the return signal meets or exceeds a predetermined criterion based on timing of the multiple pulses. For example, as illustrated in FIG. 6, the signal validity 609 may be checked in parallel with the magnitude measurement 603, and both checks may be based on the received signal 601. To receive the coding pulses, the received signal 601 may be input to a comparator 611, and converted to a digital signal that is input to a GPIO line of a microprocessor 613. The microprocessor 613 then reads the GPIO line at the appropriate time to determine if the coding pulses are present. Using a comparator 611 to identify the coding pulses (instead of, for example, the A-to-D converter 607) maximizes the speed in performing the complete measurement, thus saving current drain. The microprocessor 613 may optionally avoid using code at low received signal levels in order to further maximize performance and minimize current drain.

In accordance with the above, the coding circuit 600 performs two functions. For one, the multiple transmitted coding pulses are connected together as a single wide pulse via a sample and hold circuit 605 and used to measure received signal strength, i.e., magnitude measurement 603. The resulting wide pulse amplitude changes with signal strength and is used to assess user distance from the portable electronic device. For the other, the multiple pulses are applied to a comparator 611 whose output is digital signal. The digital signal may show multiple digital pulses indicating that it is valid signal, since the microprocessor 613 counts the multiple pulses within a set interval instead of random noise edges. Accordingly, falsing is minimized, while processing and detection speed are improved and power drain is minimized.

While the preferred embodiments of the invention have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A method of a portable electronic device for self-calibration of a proximity sensor, the method comprising:
   obtaining a background measurement by the proximity sensor, wherein the background measurement is a measure of a received signal when no signal is transmitted by the proximity sensor;
   adjusting a detection threshold of the proximity sensor based on the background measurement, the detection threshold associated with a sensitivity of the proximity sensor to environmental conditions;
   emitting a source signal by the proximity sensor based on the adjusted detection threshold of the proximity sensor; and
   receiving a return signal by the proximity sensor corresponding to the source signal.

2. The method of claim 1, wherein:
   emitting a source signal by the proximity sensor occurs multiple times: and
   obtaining a background measurement by the proximity sensor occurs before each occurrence of emitting the source signal by the proximity sensor.

3. The method of claim 1, wherein obtaining a background measurement by the proximity sensor includes obtaining the background measurement by the proximity sensor on a periodic basis.

4. The method of claim 1, further comprising:
detecting a change in the environmental conditions,
wherein obtaining a background measurement by the proximity sensor includes obtaining the background measurement in response to detecting a change in the environmental conditions.

5. The method of claim 4, wherein detecting a change in the environmental conditions includes detecting the change in environmental conditions based on information received from another proximity sensor or a sensor other than the proximity sensor.

6. The method of claim 1, further comprising:
emitting a second source signal; and
receiving a second return signal corresponding to the second source signal,
wherein obtaining a background measurement by the proximity sensor includes obtaining the background measurement subsequent to receiving the second return signal.

7. The method of claim 1, wherein adjusting a detection threshold of the proximity sensor based on the background measurement comprises identifying the background measurement as exceeding a predetermined noise threshold.

8. The method of claim 1, wherein adjusting a detection threshold of the proximity sensor based on the background measurement comprises determining an appropriate detection threshold based on information from another proximity sensor or a sensor other than the proximity sensor in conjunction with the background measurement by the proximity sensor.

9. The method of claim 8, wherein the sensor other than the proximity sensor includes at least a touch sensor, a light sensor or an accelerometer.

10. The method of claim 1, wherein adjusting a detection threshold of the proximity sensor based on the background measurement comprises determining an appropriate detection threshold based on at least date or time information in conjunction with the background measurement by the proximity sensor.

11. The method of claim 1, wherein adjusting a detection threshold of the proximity sensor based on the background measurement comprises:
accumulating a statistic of ambient background noise; and
determining an appropriate detection threshold based on the accumulated statistic.

12. The method of claim 11, wherein the accumulated statistic includes at least one of mean, standard deviation, maximum signal level, or minimum signal level.

13. The method of claim 1, further comprising performing a function of the portable electronic device based on the received return signal.

14. A method of a portable electronic device for self-calibration of a proximity sensor, the method comprising:
emitting a first source signal by the proximity sensor, the first source signal including a plurality of pulses;
receiving a first return signal by the proximity sensor corresponding to the first source signal;
determining whether the first return signal meets or exceeds a predetermined criterion based on timing of the plurality of pulses;
determining a magnitude measurement of the first return signal based on signal strength of the plurality of pulses;
adjusting a detection threshold of the proximity sensor based on the magnitude measurement in response to determining that the first return signal meets or exceeds the predetermined criterion;
emitting a first source signal by the proximity sensor based on the adjusted detection threshold of the proximity sensor; and
receiving a second return signal by the proximity sensor corresponding to the second source signal.

* * * * *